(12) United States Patent
LaRoche

(10) Patent No.: US 9,331,153 B2
(45) Date of Patent: May 3, 2016

(54) METHODS AND STRUCTURES FOR FORMING MICROSTRIP TRANSMISSION LINES ON THIN SILICON ON INSULATOR (SOI) WAFERS

(71) Applicant: Raytheon Company, Waltham, MA (US)

(72) Inventor: Jeffrey R. LaRoche, Lowell, MA (US)

(73) Assignee: RAYTHEON COMPANY, Waltham, MA (US)

( * ) Notice: Subject to any disclaimer, the term of this patent is extended or adjusted under 35 U.S.C. 154(b) by 89 days.

(21) Appl. No.: 14/105,497

(22) Filed: Dec. 13, 2013

(65) Prior Publication Data

US 2015/0171171 A1  Jun. 18, 2015

(51) Int. Cl.
| | | |
|---|---|---|
| H01L 29/20 | (2006.01) | |
| H01L 21/02 | (2006.01) | |
| H01L 21/762 | (2006.01) | |
| H01L 21/768 | (2006.01) | |
| H01L 21/8258 | (2006.01) | |
| H01L 23/66 | (2006.01) | |
| H01L 21/683 | (2006.01) | |

(52) U.S. Cl.
CPC ........ *H01L 29/2003* (2013.01); *H01L 21/0254* (2013.01); *H01L 21/6835* (2013.01); *H01L 21/76251* (2013.01); *H01L 21/76898* (2013.01); *H01L 21/8258* (2013.01); *H01L 23/66* (2013.01); *H01L 2221/68327* (2013.01); *H01L 2224/32145* (2013.01); *H01L 2924/0002* (2013.01)

(58) Field of Classification Search
None
See application file for complete search history.

(56) References Cited

U.S. PATENT DOCUMENTS

2003/0020069 A1* 1/2003 Holmes ............. H01L 21/31691
257/76
2009/0050939 A1* 2/2009 Briere ........................... 257/201
(Continued)

FOREIGN PATENT DOCUMENTS

EP  2 546 883  1/2013

OTHER PUBLICATIONS

Alessio Pantellini et al.:"Thermal behavior of AlGaN/GaN HEMT on silicon Microstrip technology" Microwave Intergrated Circuits Conference (EUMIC), 2011 European,IEEE, Oct. 10, 2011, pp. 132-135, XP032073166, ISBN: 978-1-61284-236-3 Section II:"Fabrication Process".

(Continued)

*Primary Examiner* — Robert Bachner
(74) *Attorney, Agent, or Firm* — Daly, Crowley, Mofford & Durkee, LLP

(57) ABSTRACT

A structure is provided having: (A) a first silicon layer and a first silicon dioxide layer over the first silicon layer; and (B) a second silicon layer and a second silicon dioxide layer over the second silicon layer; the first silicon dioxide layer bonded to the second silicon dioxide layer. An upper surface of the first silicon layer is polished to reduce its thickness. A III-V layer is grown on the upper surface of the thinned silicon layer. A III-V device is formed in the III-V layer together with a strip conductor connected to the formed. The second silicon layer, the second silicon dioxide layer and the first silicon dioxide layer are successively removed to expose a bottom surface of the first silicon layer. A ground plane conductor is formed on the exposed bottom surface, the strip conductor and the ground plane conductor providing a microstrip transmission line.

17 Claims, 19 Drawing Sheets

(56) References Cited

U.S. PATENT DOCUMENTS

2011/0180857 A1* 7/2011 Hoke ............... H01L 21/76251
 257/255
2013/0221433 A1 8/2013 Molin et al.

OTHER PUBLICATIONS

Search Report and Written Opinion dated Jan. 20, 2015 for international PCT Application No. PCT/US2014/064019; 13 pages.

* cited by examiner

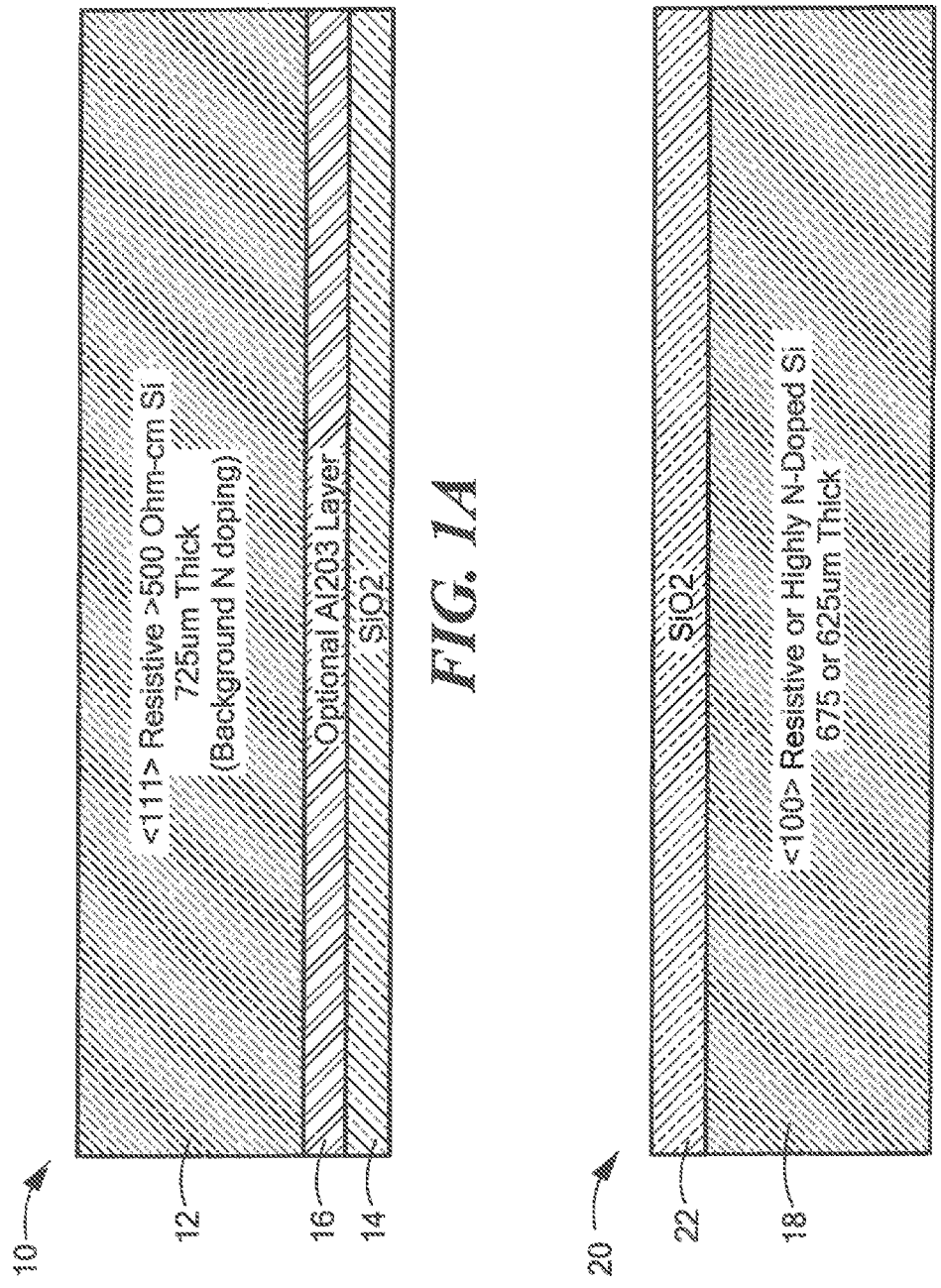

_METHODS AND STRUCTURES FOR FORMING MICROSTRIP TRANSMISSION LINES ON THIN SILICON ON INSULATOR (SOI) WAFERS_

TECHNICAL FIELD

This disclosure relates generally to semiconductor structures and manufacturing methods and more particular to methods and structures for forming microstrip transmission lines on thin III-V, such as GaN on Silicon On Insulator (SOI) wafers in order to reduce wafer breakage and simplify via processing.

BACKGROUND

As is known in the art, CMOS transistors are sometimes formed in a silicon layer disposed on an insulator substrate. In one structure, the fabrication of these CMOS devices is performed on a wafer having a thickness of about 725 microns, doped silicon substrate with a <100> crystallographic orientation. The wafer has a 1400-2000 thick silicon dioxide layer on the upper surface of the substrate and a 1-2 micron thick single crystal silicon layer on the silicon dioxide layer. The wafer is processed to form CMOS transistors in the upper silicon layer. The use of the doped substrate is used to reduce wafer breakage.

As is also known in the art, it is sometimes desirable to form III-V devices on a substrate as a Monolithic Microwave Integrated Circuit (MMIC). In one such structure, a silicon wafer, for example an eight inch silicon wafer of <111> silicon having a thickness of about 725 microns has a layer of III-V material, such as GaN formed on the upper surface using MOCVD or MBE. In the MMIC, microstrip transmission lines are sometimes used to interconnect active, such FET devices, and passive devices formed on, or in, the III-V layer. In such case, after forming the FET and strip conductors from the microstrip transmission lines, the 725 micron thick wafer must be thinned or polished to 50-100 microns for the microstrip transmission line ground plane conductor which will be formed on the backside of the wafer and to accommodate conducive vias which pass from the ground plane to electrodes of the FET. The process of thinning or polishing the backside of the wafer and formation of the vias from the backside of the wafer, however, are difficult to control. Additionally, the high resistance <111> silicon needed for low loss high frequency transmission lines suffers higher wafer breakage. This is due to the fact that the low oxygen content of the Si needed for high resistance (>500 Ohm-cm) makes the Si wafer more brittle.

SUMMARY

In accordance with the present disclosure, a structure is provided having: a first silicon layer; an insulating layer; and a second silicon layer, the insulating layer being disposed between the first silicon layer and the second silicon layer, the second silicon layer being thicker than the first silicon layer; a III-V layer disposed on an upper surface of the first silicon layer.

In one embodiment, the first silicon layer has a <111> crystallographic orientation.

In one embodiment, the first silicon layer has a thickness of 50-100 microns.

In one embodiment, the first silicon layer is intentionally or unintentionally doped.

In one embodiment, the second silicon layer has a thickness of 675-625 microns.

In one embodiment, the second silicon layer has a doping concentration higher than the doping concentration of the first silicon layer.

In one embodiment, the insulating layer comprises silicon dioxide.

In one embodiment, a method is provided, comprising providing a structure having: (A) a first silicon layer and a first silicon dioxide layer over the first silicon layer; and (B) a second silicon layer and a second silicon dioxide layer over the second silicon layer; the first silicon dioxide layer bonded to the second silicon dioxide layer. An upper surface of the first silicon layer is polished to reduce its thickness. A III-V layer is grown on the upper surface of the thinned silicon layer. A III-V device is formed in the III-V layer together with a strip conductor connected to the formed device and conductive vias through the both III-V layer and the first silicon layer. The second silicon layer, the second silicon dioxide layer and the first silicon dioxide layer are successively removed to expose a bottom surface of the first silicon layer. A ground plane conductor is formed on the exposed bottom surface, the strip conductor and the ground plane conductor providing a microstrip transmission line.

In one embodiment, a method includes: (A) providing a structure having: a first silicon layer; an insulating layer; and second silicon layer, the insulating layer being disposed between the first silicon layer and the second silicon layer, the second silicon layer being thicker than the first silicon layer; and, a III-V layer disposed on an upper surface of the first silicon layer; (B) forming a III-V device in the III-V layer and a strip conductor connected to the device; (C) removing the insulating layer and the second silicon layer to expose a bottom surface of first silicon layer; and (D) forming a ground plane conductor on the exposed bottom surface of the first silicon layer connected to provide, with the strip conductor, a microstrip transmission line.

In one embodiment, a first structure is provided having: a silicon layer and a silicon dioxide layer over the silicon layer, a second structure is provided having: a silicon layer and a silicon dioxide layer over the silicon layer; the silicon dioxide layer of the first structure is bonded to the silicon dioxide layer of the second structure to form a laminated structure. An upper surface of the silicon layer of the first structure is polished to reduce the thickness of the silicon layer of the first structure to a thickness of 50-100 micron; a III-V layer is grown on the upper surface of the thinned silicon layer of the first structure of the laminated structure. A III-V device is formed in the III-V layer together with a strip conductor connected to the formed device over a surface of the III-V layer and electrically conductive vias to the device and through the both III-V layer and the silicon layer of the first structure. The second structure and the silicon dioxide layer on the first structure are removed from the silicon layer of the first structure to expose a bottom surface of the first silicon layer. A ground plane conductor is formed on the exposed bottom surface of the silicon layer of the first structure, the strip conductor and the ground plane conductor providing a microstrip transmission line.

The details of one or more embodiments of the disclosure are set forth in the accompanying drawings and the description below. Other features, objects, and advantages of the disclosure will be apparent from the description and drawings, and from the claims.

DESCRIPTION OF DRAWINGS

FIGS. 1A-1H are diagrammatical cross-sectional sketches of a semiconductor structure at various stages in the fabrication according to the disclosure;

Like reference symbols in the various drawings indicate like elements.

DETAILED DESCRIPTION

Figure 1C:
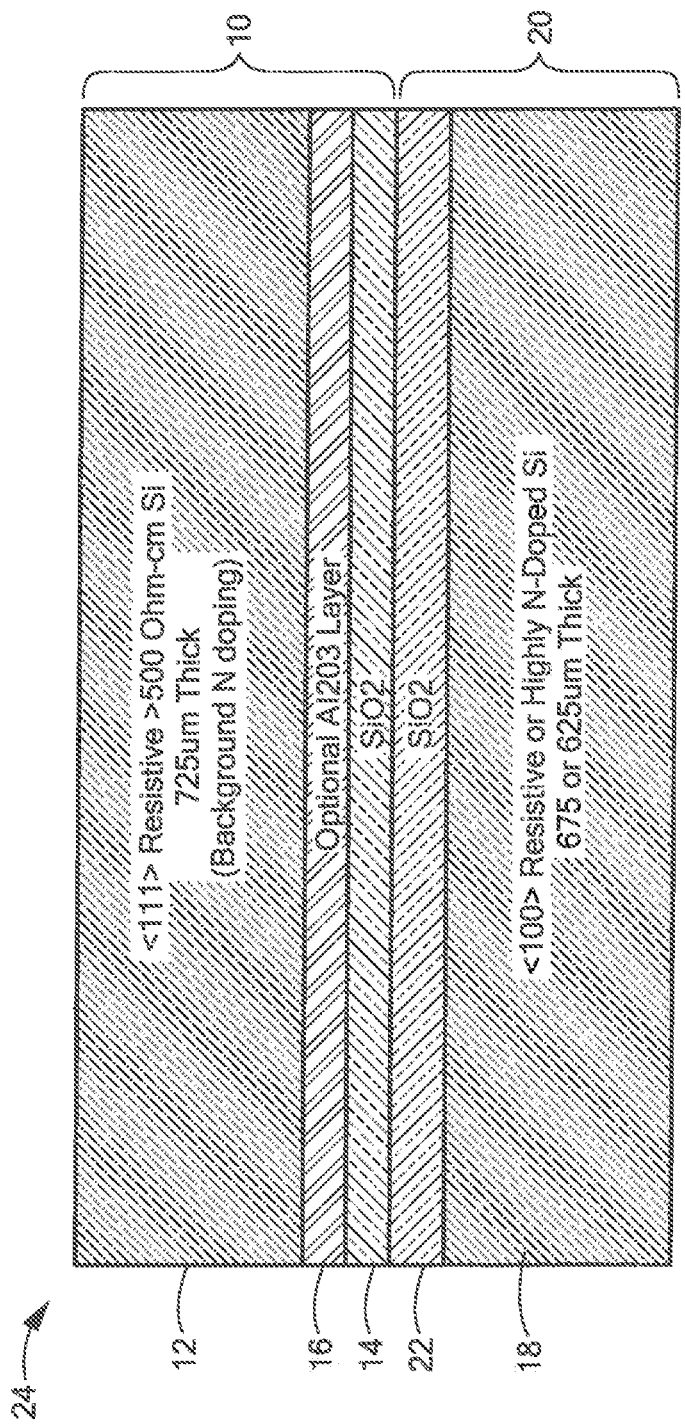
Figure 2:
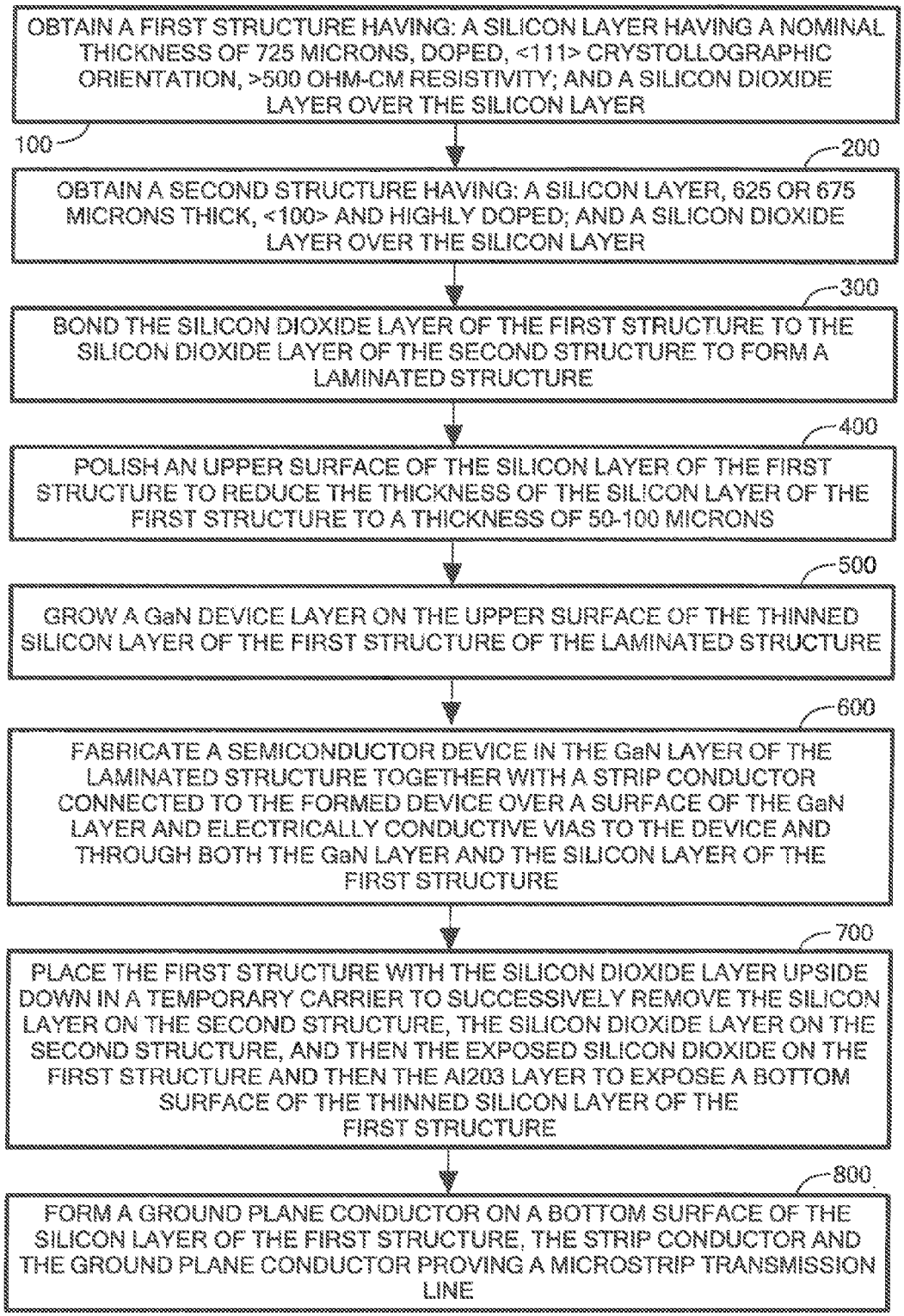
FIG. 2 is a flow chart of a process used to form the structure of FIGS. 1A-1H in accordance with the disclosure.
Figure 3:
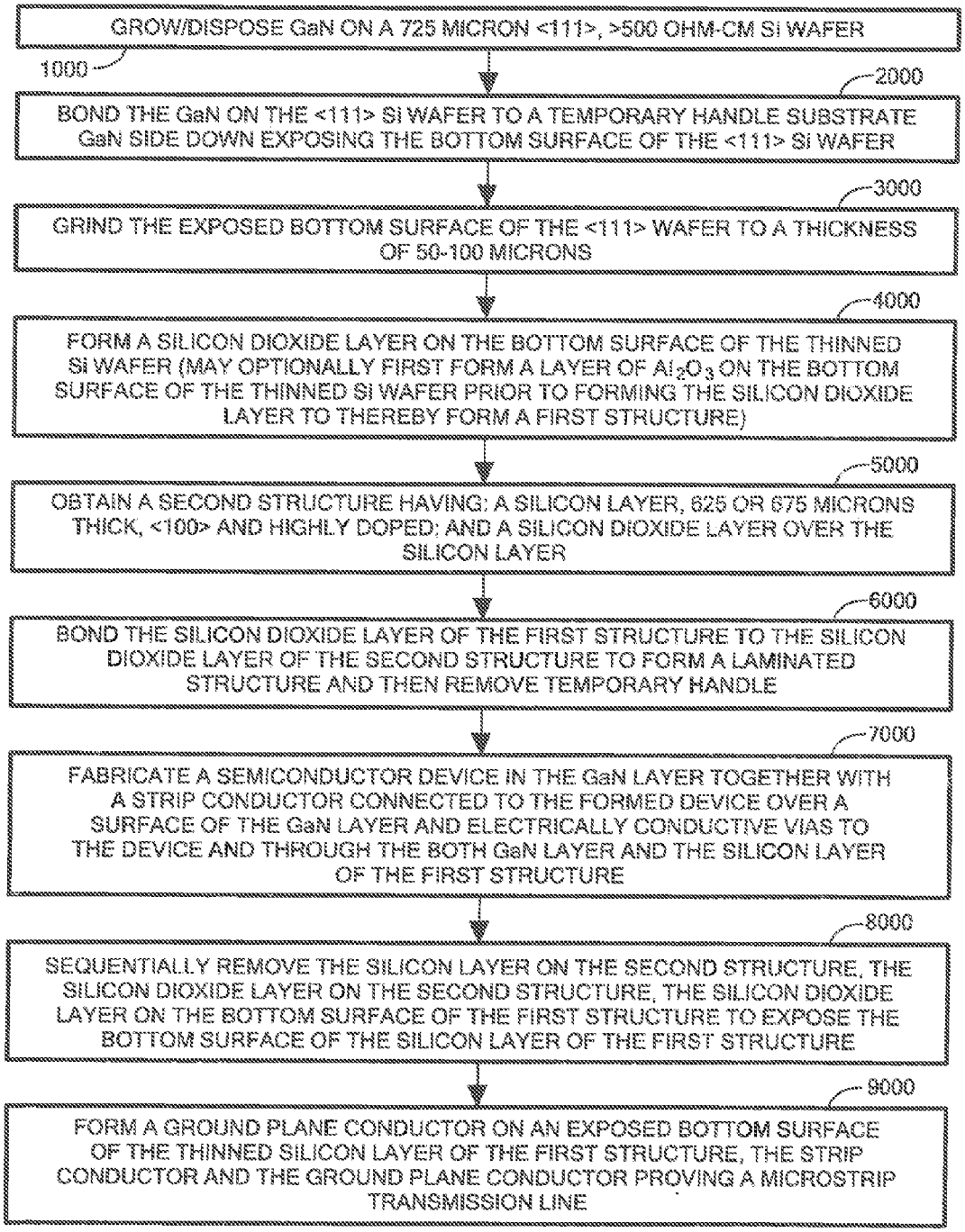
FIG. 3 is a flow chart of a process in accordance with an alternate embodiment of the disclosure.

Referring now to FIG. 1A and step 100 of FIG. 2, a first structure 10 is obtained having: a silicon layer 12 with a nominal thickness of 725 microns, <111> crystallographic orientation, and lightly doped, preferably n-type, to have a resistivity >500 ohm-cm; with a silicon dioxide layer 14 over the silicon layer 12. An optional etch stop layer 16, here for example, $Al_2O_3$ is may be disposed between the silicon dioxide layer 14 and the silicon layer 12, as shown.

Referring now to FIG. 1B and step 200 of FIG. 2, a second structure 20 is obtained having: a silicon layer 18, 625-675 microns thick, and more highly doped; and a silicon dioxide layer 22 over the silicon layer.

Referring now to FIG. 1C and step 300 of FIG. 2, the silicon dioxide layer 14 of the first structure 10 is bonded to the silicon dioxide layer 22 of the second structure 20 to form a laminated structure 24.

Figure 1D:
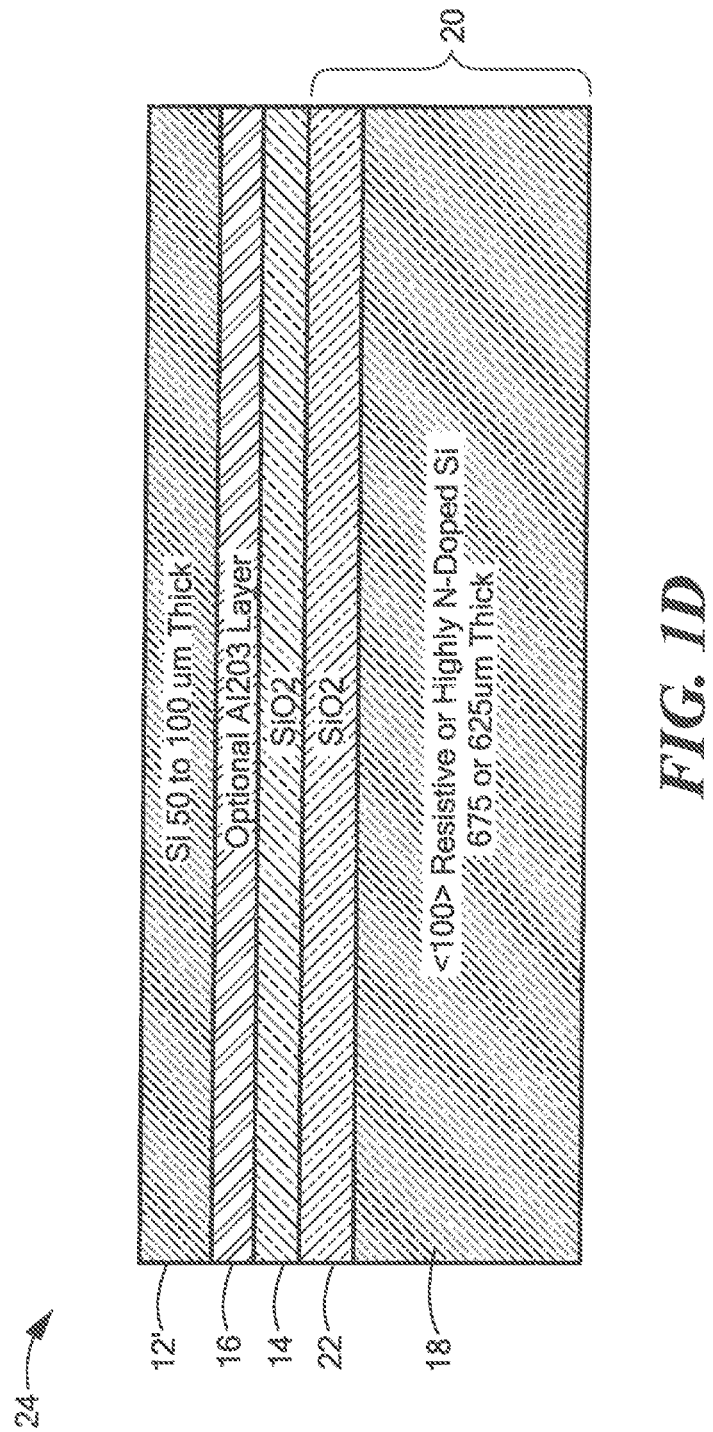

Referring now to FIG. 1D and step 400 of FIG. 2, the upper surface of the silicon layer 12 (FIG. 1C) of the first structure is polished to reduce the thickness of the silicon layer 12 to a thinner silicon layer 12' (FIG. 1D), here to a thickness of 50-100 micron.

Figure 1E:
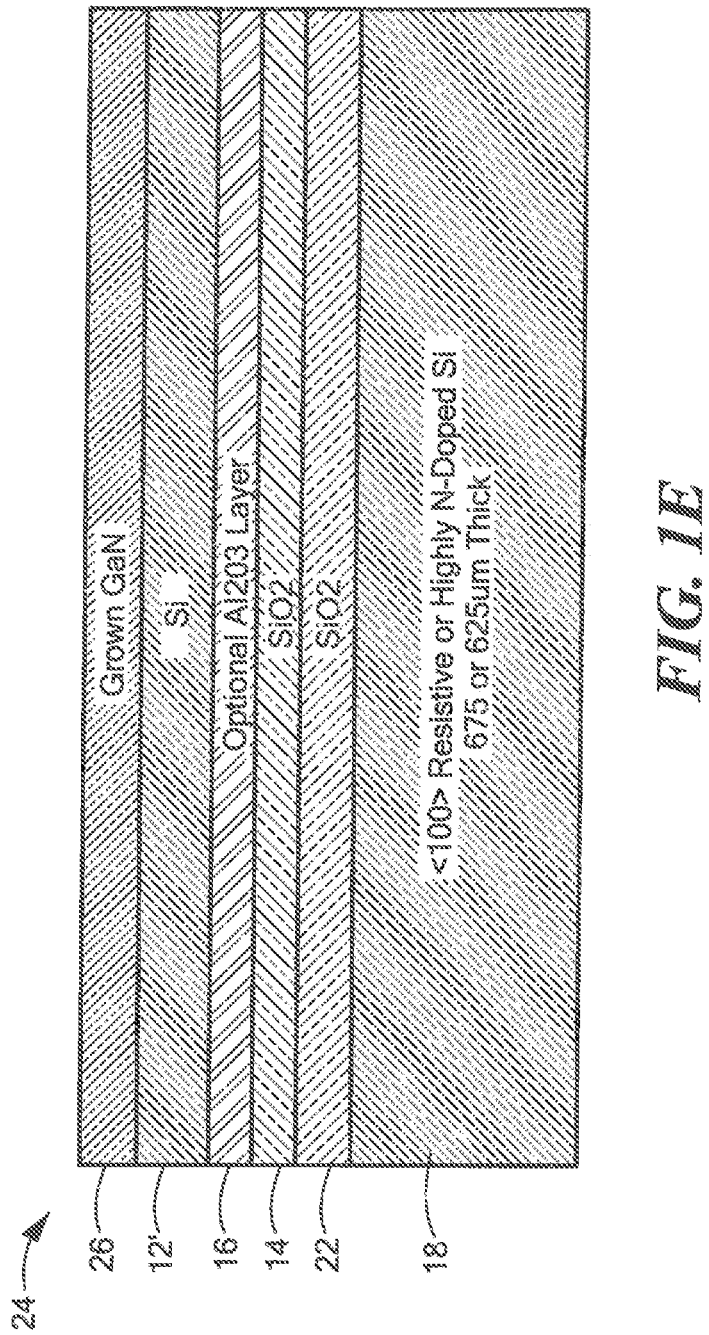

Next, referring to FIG. 1E and step 500 of FIG. 2, a layer 26 of Column III-V material, here for example, GaN, is grown on the upper surface of the thinned silicon layer 12', by, for example, MOCVD or MBE.

Figure 1F:
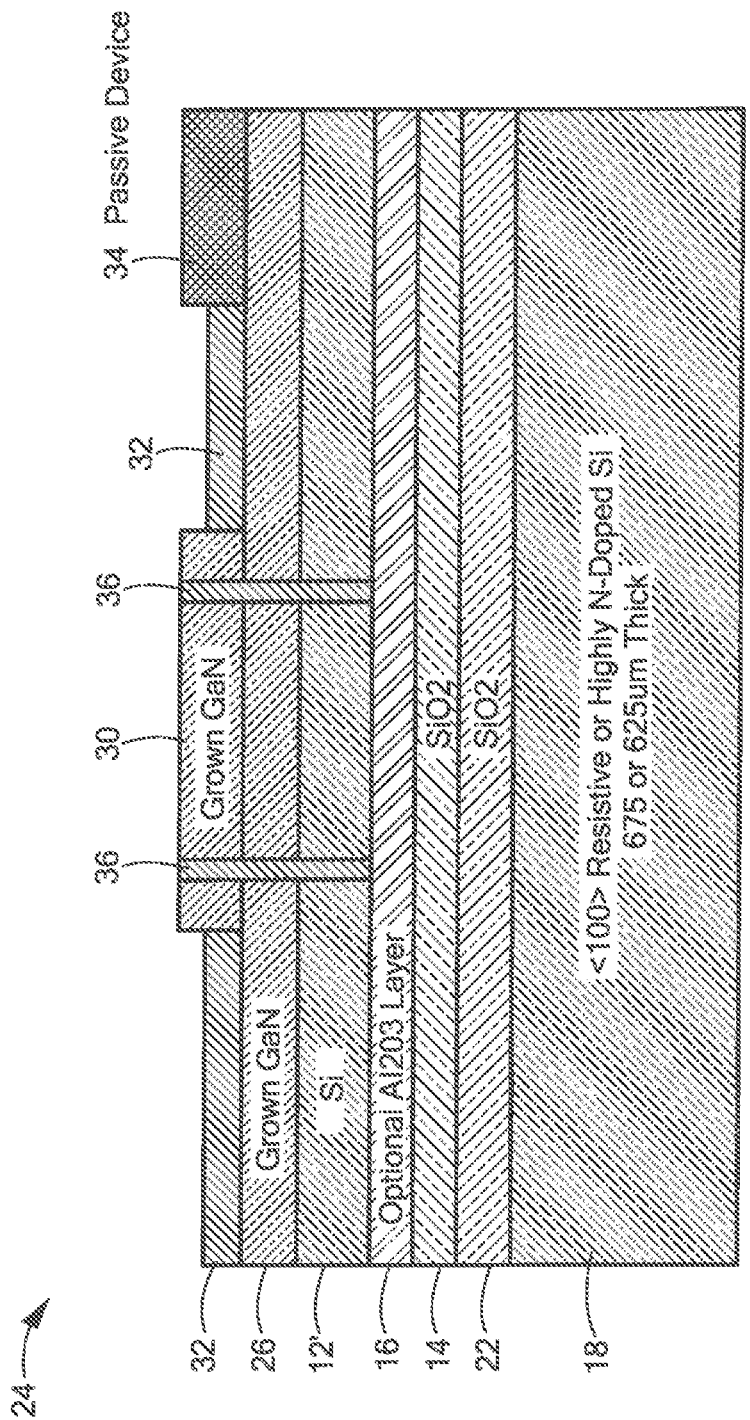

Next, referring to FIG. 1F and step 600 of FIG. 2, a III-V device 30, here for example, a GaN HEMT FET active device is formed in the III-V layer 26 along with a strip conductors 32 connected to the device, 26 and a passive device 34 and an electrically conductive vias 36 to electrodes, such as the source electrode not shown of device 26 (it being noted that neither the gate electrode nor drain electrode is shown in FIG. 2) and vertically through the III-V layer 26 and through an underlying portion of the thinner silicon layer 12' finally stopping at the interface of the thinner Si (layer 12') and underlying dielectric which is either $SiO_2$ (layer 14) or the optional $Al_2O_3$ layer (layer 16).

Figure 1G:
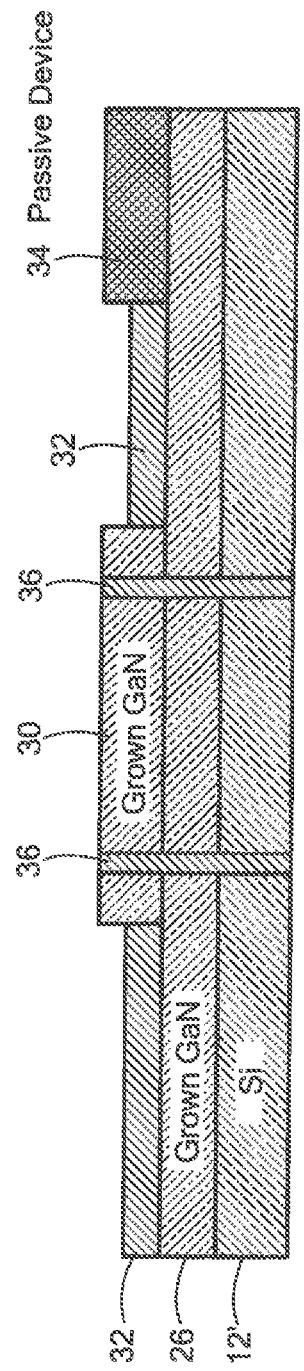

Next, the laminated structure shown in FIG. 1F and step 700 of FIG. 2, is placed upside down in a temporary carrier, not shown, to remove, as by polishing or etching, the silicon layer 18, and then the silicon dioxide layer 22, then the silicon dioxide layer 14 and finally the optional $Al_2O_3$ layer 16 (if present), to expose the bottom surface of the thinned silicon layer 12. The resulting structure is shown in FIG. 1G.

Figure 1H:
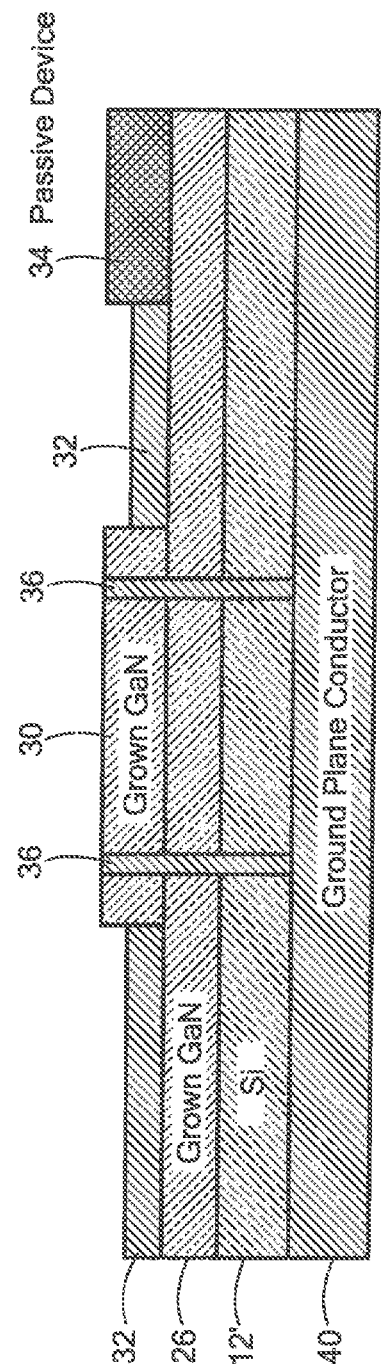

Next, referring to FIG. 1H and step 800 of FIG. 2, a ground plane conductor 40 is formed on a bottom surface of the thinned silicon layer 12'; the strip conductor 32 and the ground plane conductor 40 providing a microstrip transmission line. The completed structure is in most cases then removed from the temporary carrier.

It should be understood that the second Si structure (layer 18) has been designated as 625-675 μm thick (rather than the SEMI International Standards San Jose 3081 Zanker Road San Jose, Calif. 95134, USA conventional 725 μm for 200 mm wafers) in order to compensate for the 100-50 μm the thickness of the first Si structure (layer 12). This is so that the overall thickness of the final bonded wafer stack will be close to the nominal 725 μm semi standard thickness for 200 mm wafers, and therefore avoid wafer handling issues in current, standard processing tools.

The primary purpose of the thick bonded top Si or compound semiconductor layer is to minimize backside processing needed at foundries to facilitate microstrip devices. That is, the source vias can be etched and metallized from the frontside. As a result, only minimal backside processing is needed to facilitate a high yield microstrip process. The secondary purpose of the substrate design is to eliminate wafer breakage due to processing of low oxygen content, high resistance <111> GaN on Si Substrates.

Figure 4A:
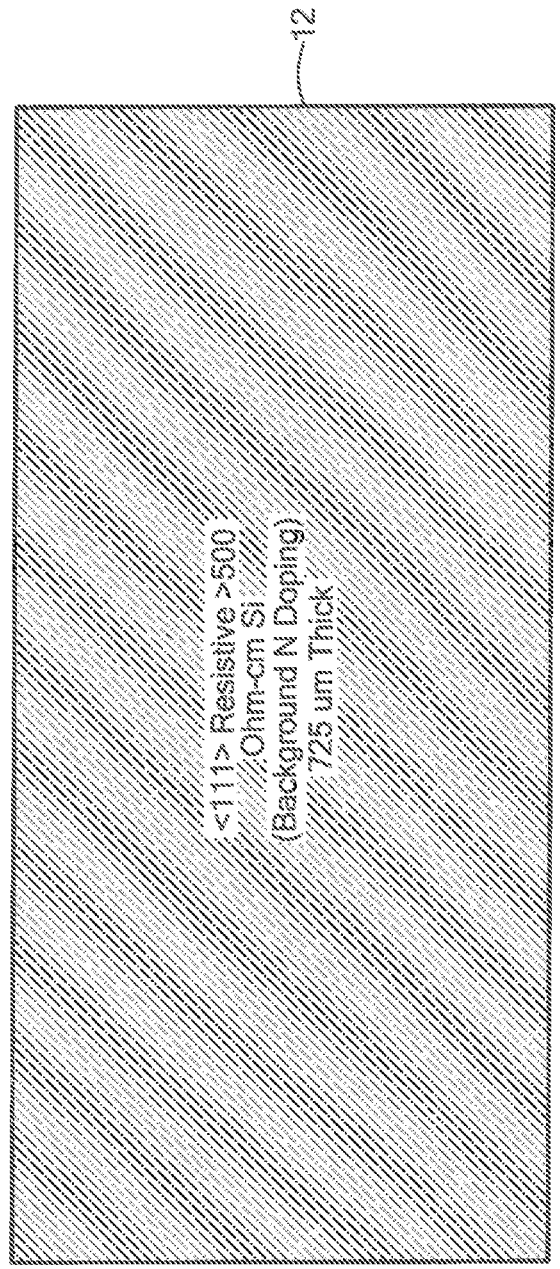
FIGS. 4A-4K are diagrammatical cross-sectional sketches of a semiconductor structure at various stages in the fabrication according to the alternate embodiments of FIG. 3.
Figure 4B:
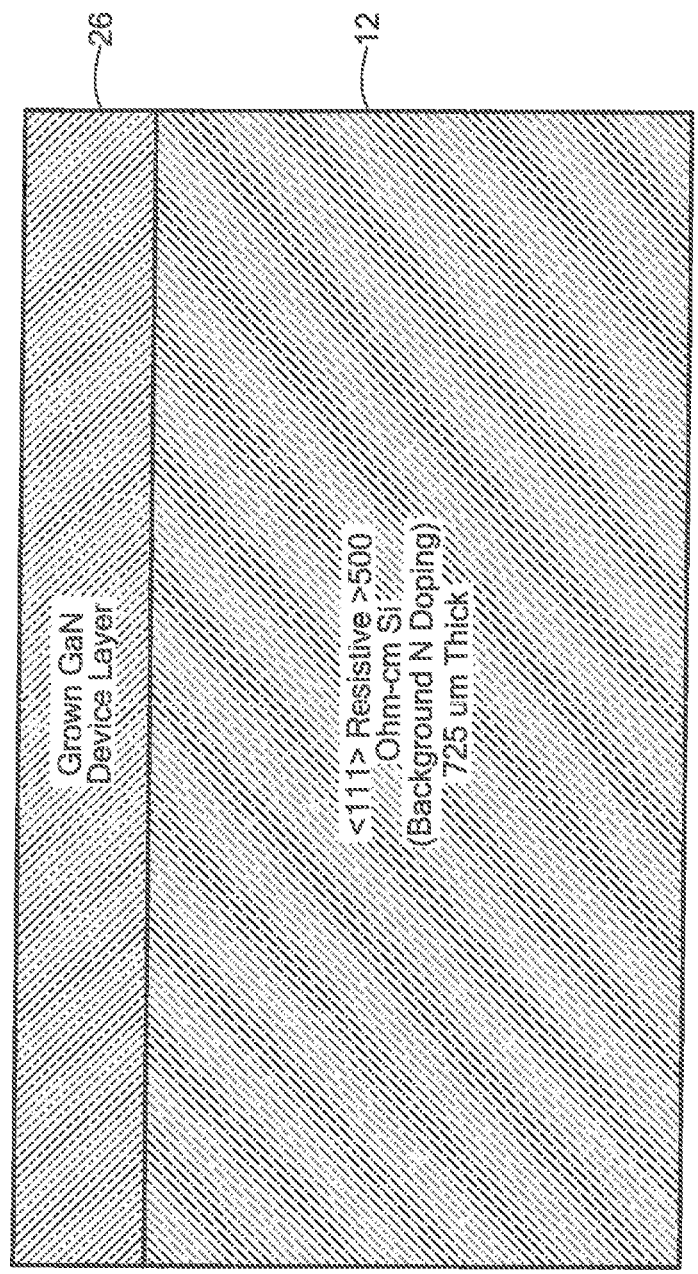
Figure 4C:
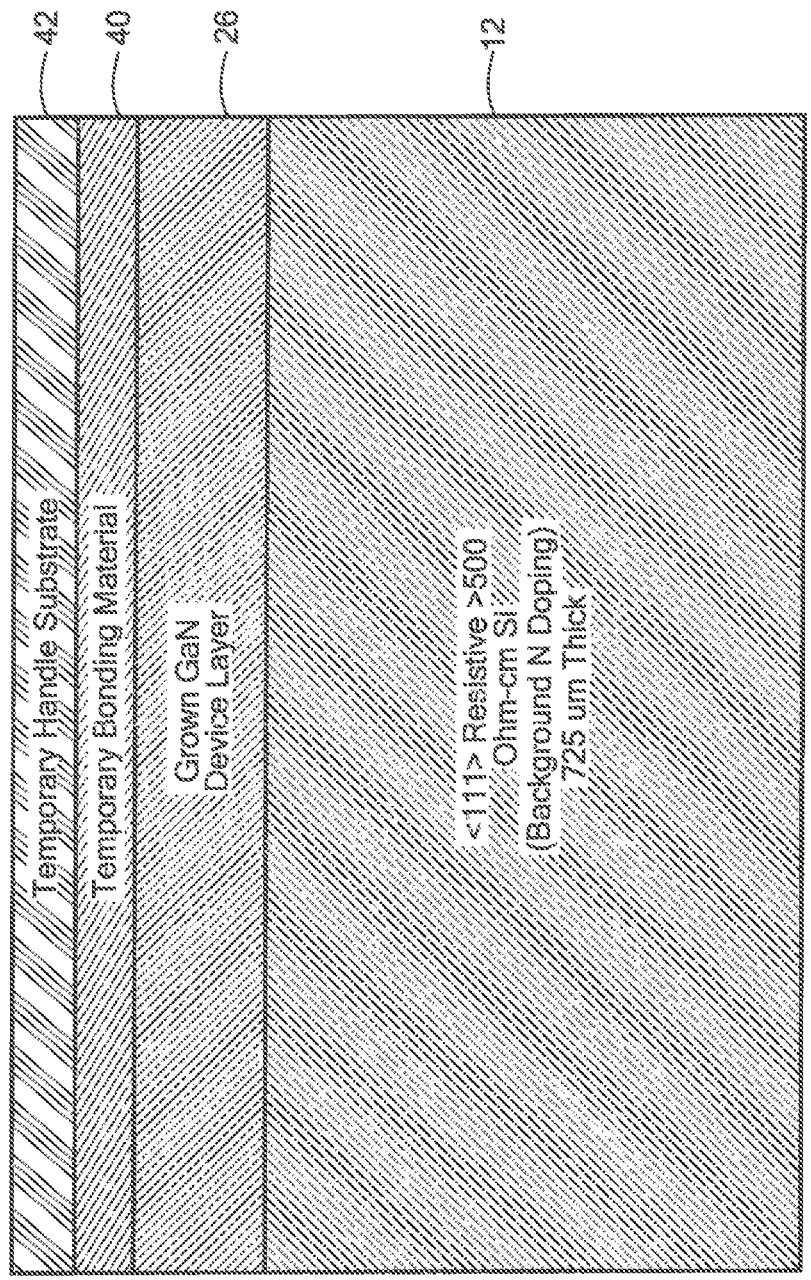
Figure 4D:
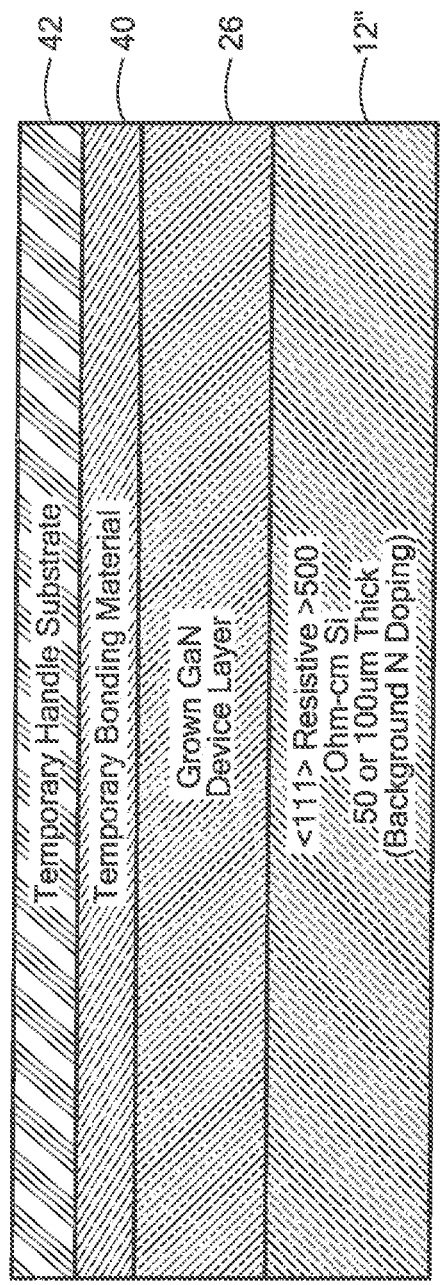
Figure 4E:
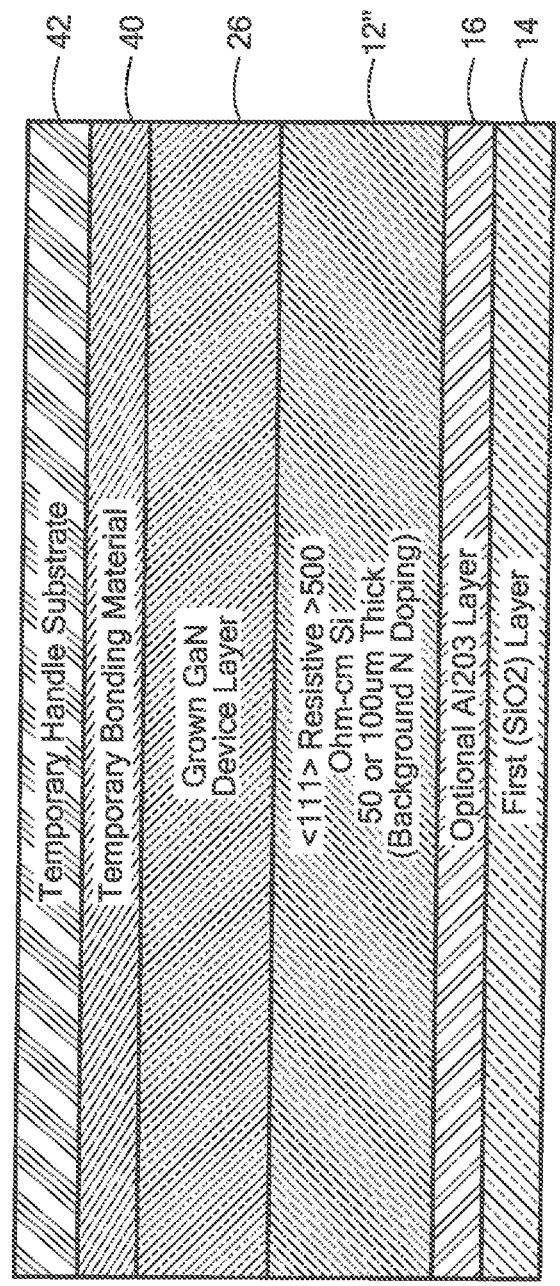
Figure 4F:
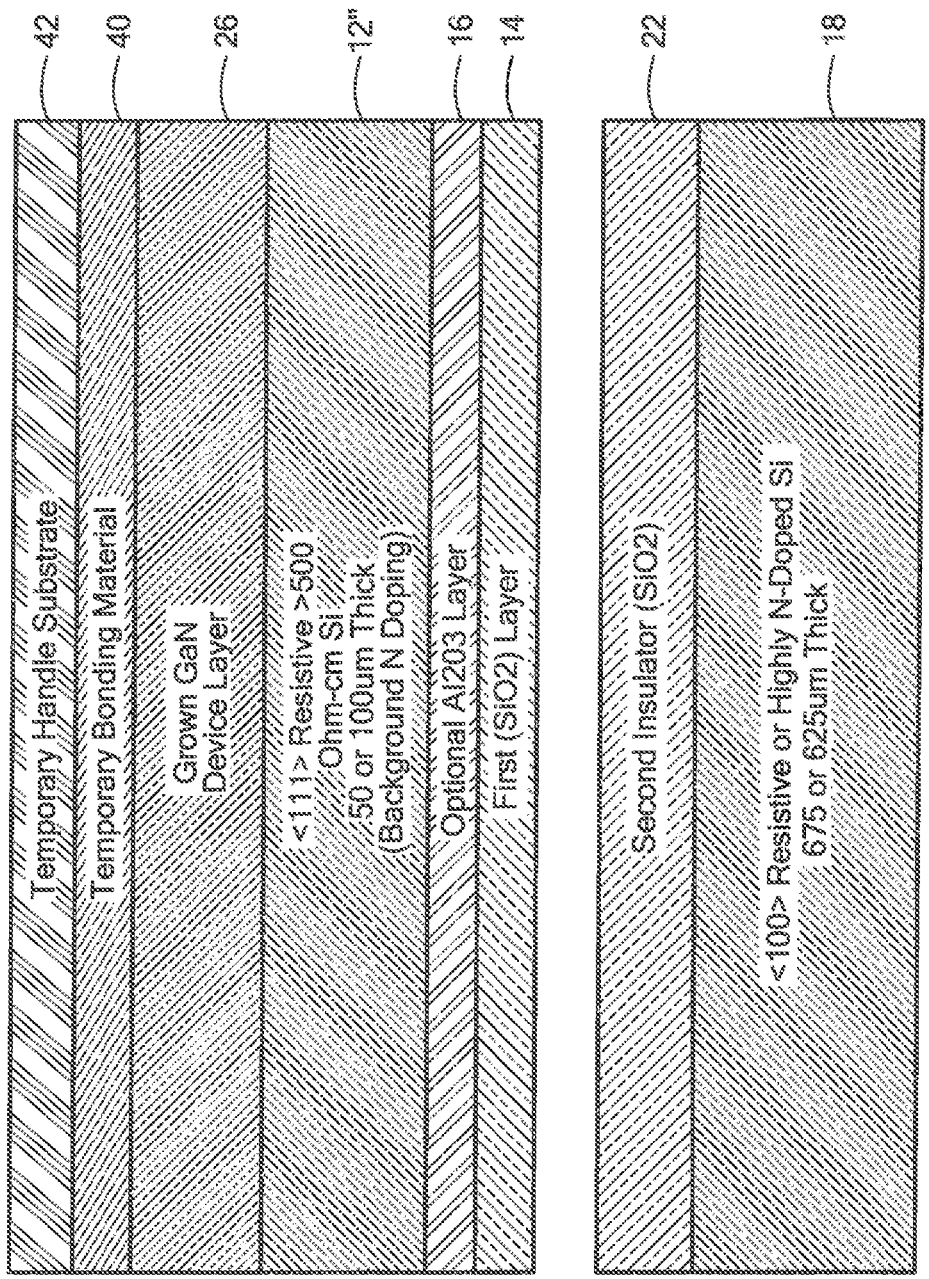
Figure 4G:
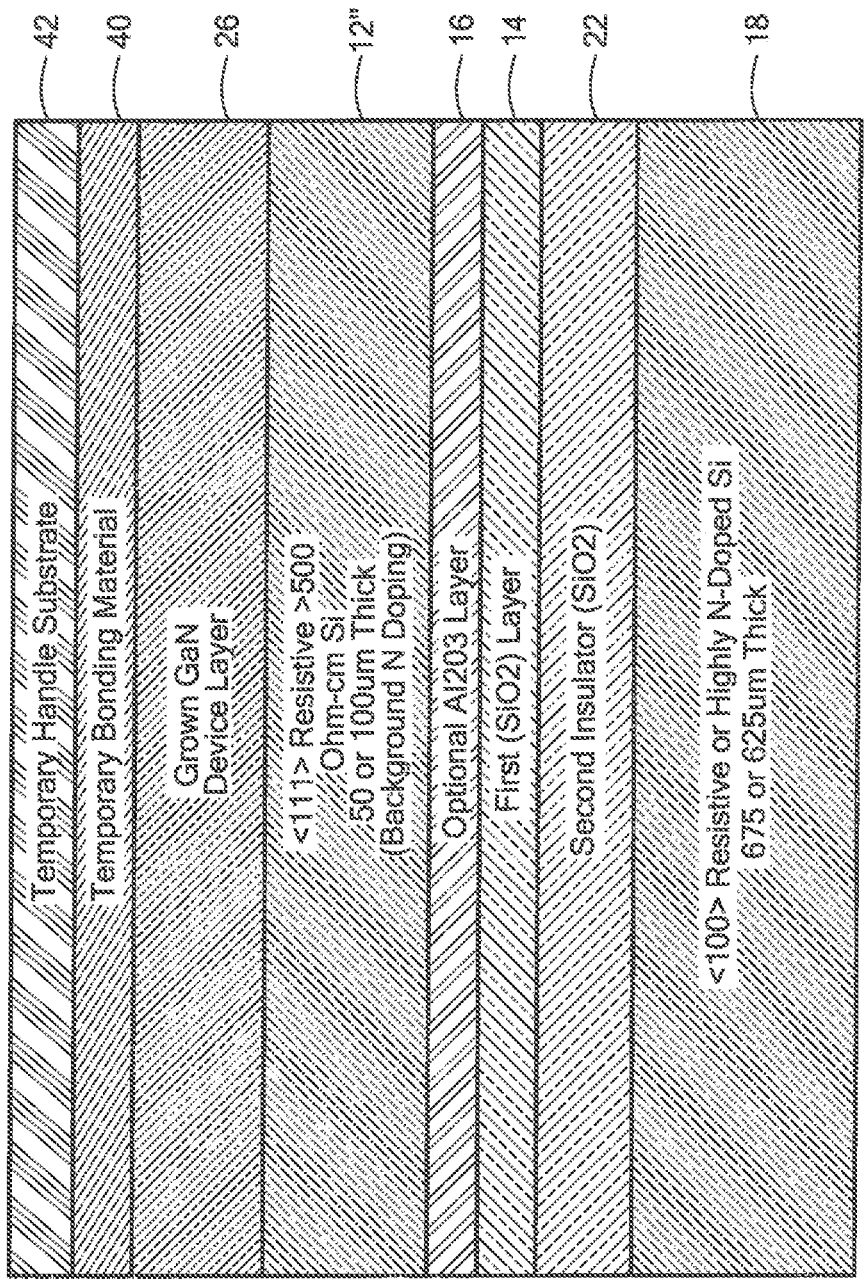
Figure 4H:
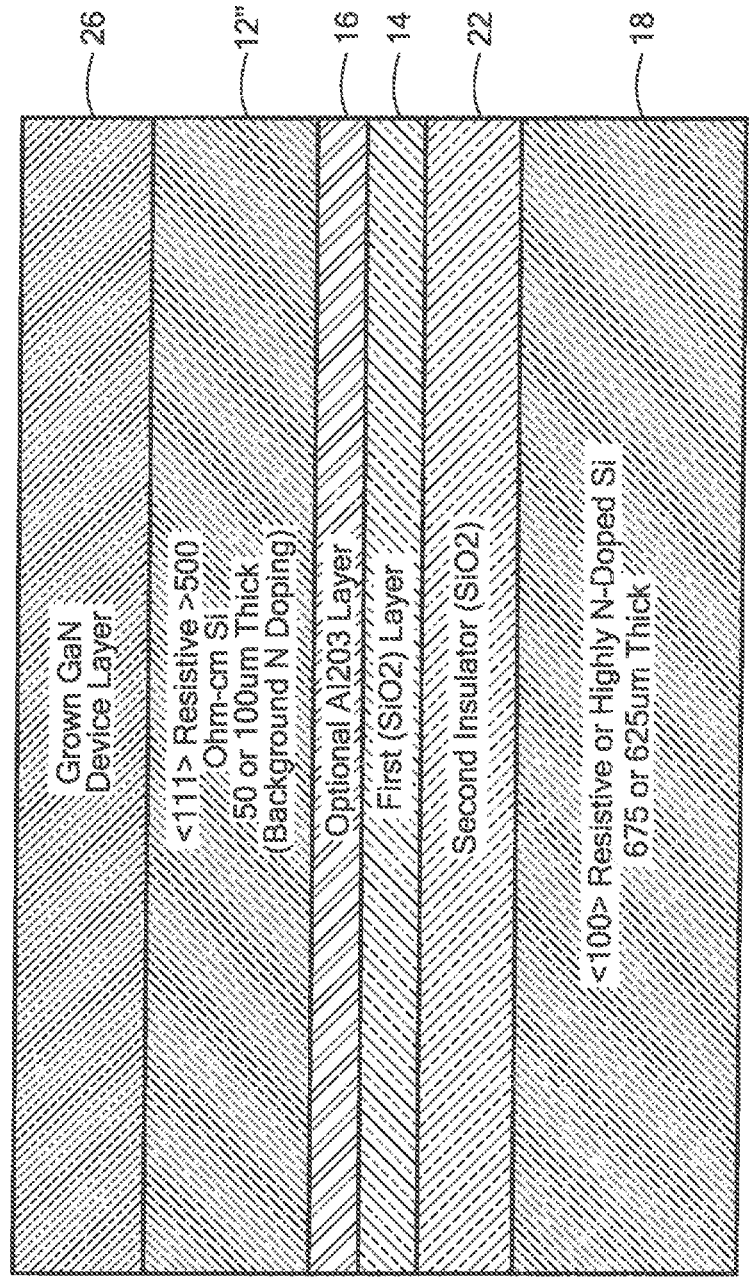
Figure 4I:
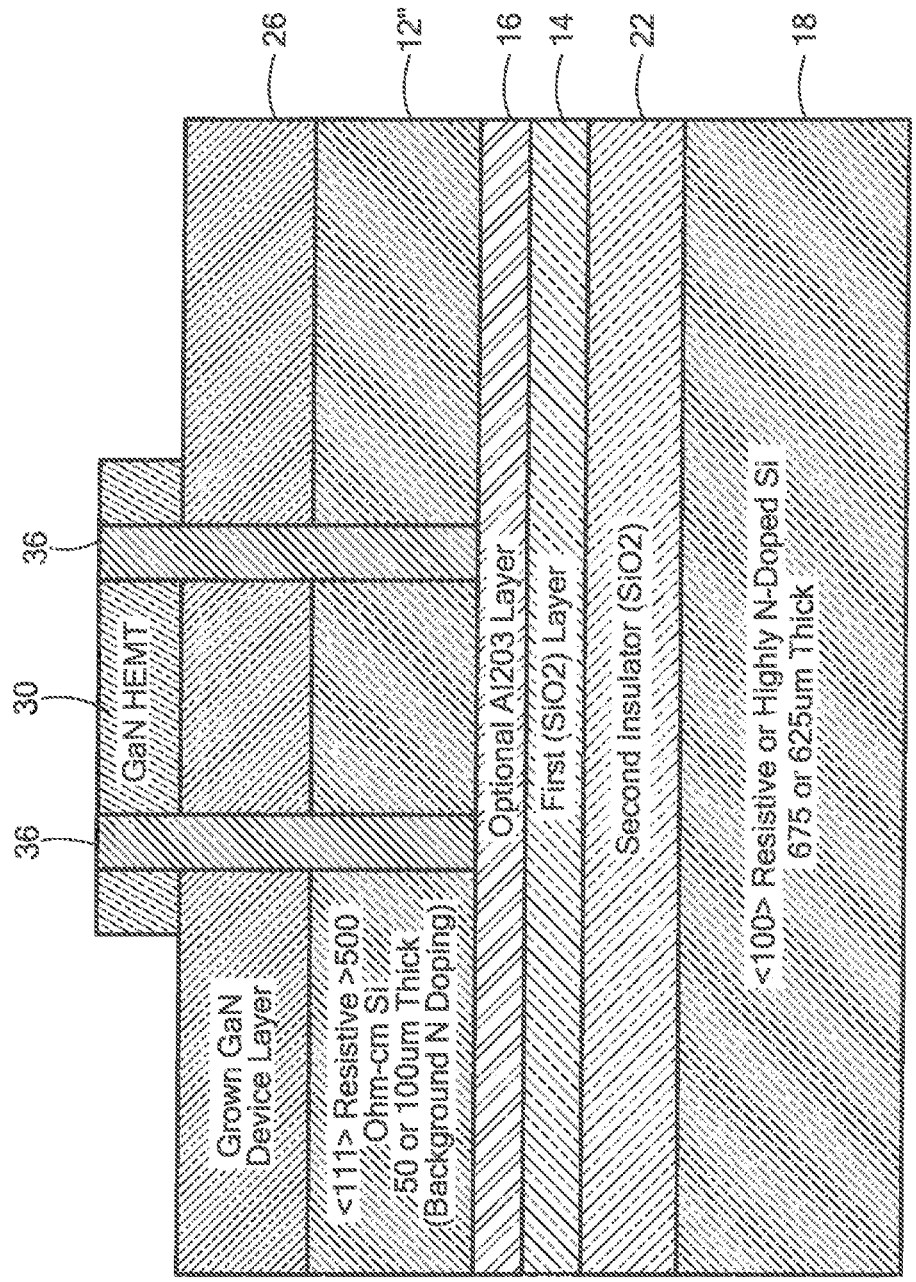
Figure 4J:
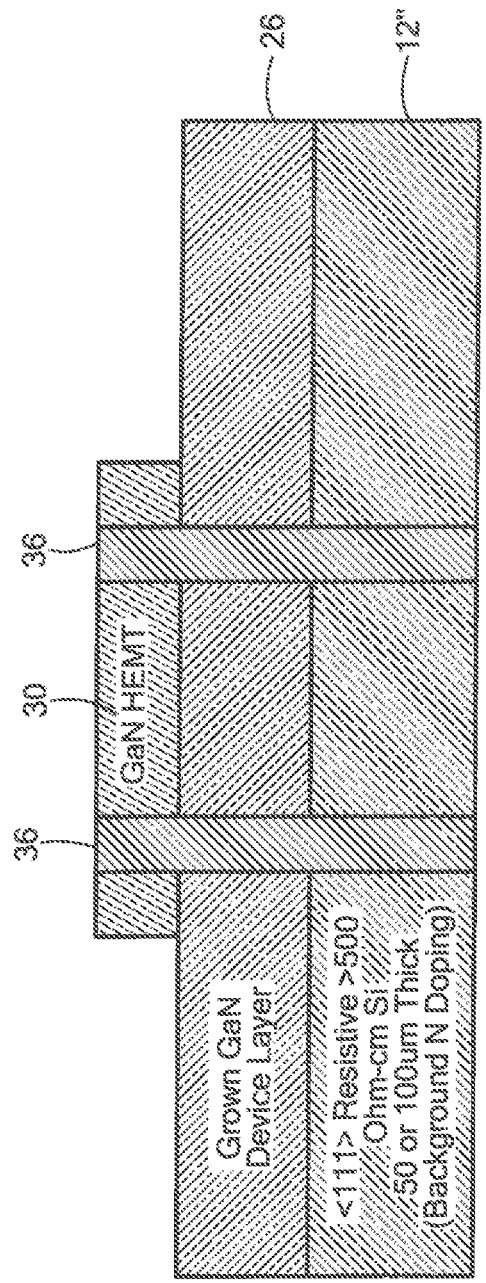
Figure 4K:
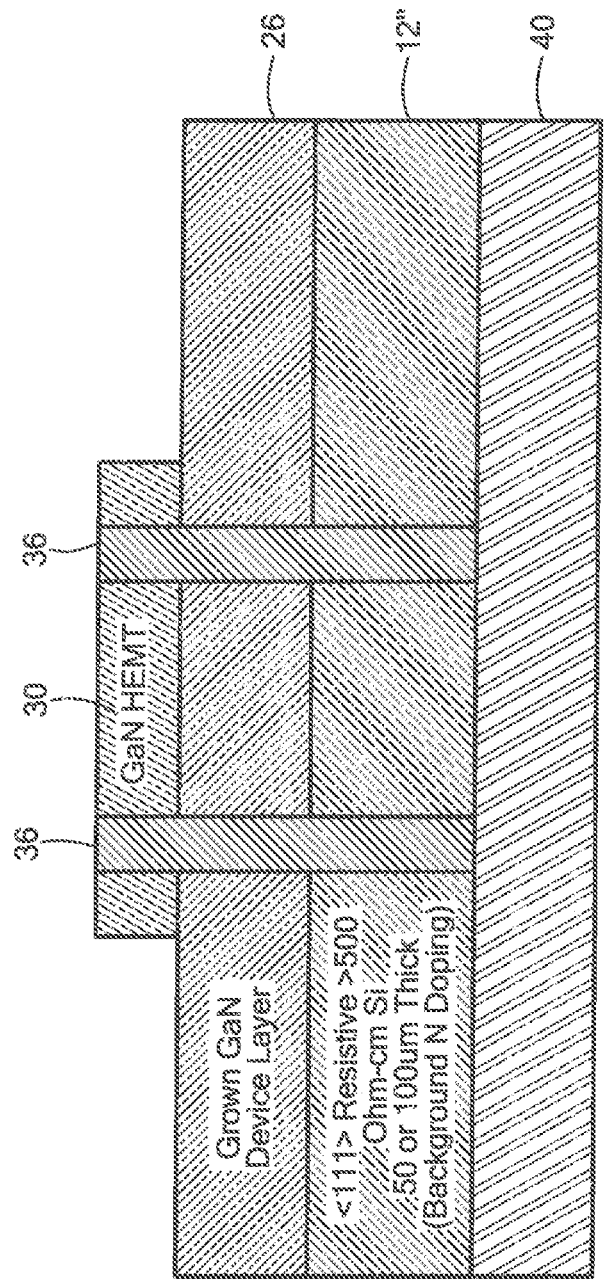

Referring now to FIG. 3 and FIGS. 4A-4K, an alternative embodiment is described. Here, a 725 micron <111>, >500 ohm-cm Si wafer (FIG. 4A) is provided and has grown on the upper surface thereof the III-V (for example GaN) layer 26 (FIG. 4B), Step 1000 (FIG. 3) Next, the GaN layer 26 is bonded to a temporary handle substrate 42 (FIG. 4C) with a suitable temporary bonding material 42, such as, for example silicon dioxide, (Step 2000) exposing the bottom surface of the <111> Si wafer 12. Next, the exposed bottom surface of the wafer 12 is polished or grinded to reduce the thickness of silicon layer 12 to a thickness of 50-100 microns (FIG. 4A, Step 3000). Next, a layer 14 of silicon dioxide is formed on the bottom surface of the thinned silicon layer 12" it being noted that a layer of $Al_2O_3$ (layer 16) may be formed on the bottom surface of the thinned silicon wafer 12" prior to forming the silicon dioxide layer 14 (FIG. 4E, Step 4000) to thereby form a first structure. Next, A second structure 20 (FIG. 4F) is obtained having: silicon layer 18, 625 or 675 microns thick, <100> and highly doped; and a silicon dioxide layer 22 over the silicon layer 18, Step 5000. Next, the silicon dioxide layer 14 of the first structure is bonded to the silicon dioxide layer 22 of the second structure to form a laminated structure, FIG. 4G, Step 6000. Next, the temporary handle is removed, FIG. 4H. Next, a semiconductor device 30 (FIG. 4I) is formed in the GaN layer 30 together with a strip conductor (not shown) connected to the formed device 30 over a surface of the GaN layer 26, as described above in connection with FIG. 1F, along with electrically conductive vias 36 to the device 30 and through the both GaN layer 26 and the silicon layer 12" (FIG. 4I, Step 7000). Next, the silicon layer 18, the silicon dioxide layer 22, the silicon dioxide layer 14 and, if formed, the $Al_2O_3$ layer 16 are sequentially removed to expose the bottom surface of the silicon layer 12" (FIG. 4J, Step 8000). Next, a ground plane conductor 40 (FIG. 4K, Step 9000) is formed on the exposed bottom surface of the thinned silicon layer 16, Step 9000).

In another embodiment, the top surface of the silicon layer 12 (FIG. 1) is bonded to a temporary handle, and then the bottom surface of the silicon layer is thinned. The optional $Al_2O_3$ layer 16 and the silicon dioxide layer 14 are then formed on the bottom surface of the thinned silicon layer forming the first structure. The silicon dioxide layer of the second structure is bonded to the silicon dioxide layer of the first structure. The temporary handle is removed exposing the upper surface of the thinner silicon layer. Next, the GaN layer is grown in the exposed upper surface of the thinned silicon layer. The structure is then processed as described above in connection with FIGS. 1F through 1H.

A number of embodiments of the disclosure have been described. Nevertheless, it will be understood that various modifications may be made without departing from the spirit and scope of the disclosure. For example, all the oxide used in wafer bonding may be deposited or grown on either the first Si structure (layer 12) or the second Si structure (layer 18) and then bonded to the native oxide of the bare Si wafer. Additionally, the thicknesses of the first Si layer, second Si layer, and oxide layer can be changed from those described above and still fall within the spirit and scope of this disclosure. Still further, an additional thin Si layer (typically 1-2 µm) may be bonded on top of the 50-100 µm <111> Si and thick 675-625 µm Si substrate to form a tri-layer substrate that would allow CMOS processing and GaN growth in windows (exposed <111> Si regions) and GaN device processing on the same substrate. This in turn would allow for heterogeneously integrated GaN/CMOS circuits. Accordingly, other embodiments are within the scope of the following claims.

What is claimed is:

1. A structure, comprising:
   a first silicon layer;
   a first insulating layer disposed under the first silicon layer;
   a second insulating layer;
   a second silicon layer, disposed under the second insulating layer;
   wherein the first insulating layer is directly bonded to the second insulating layer;
   wherein the second silicon layer is thicker than the first silicon layer; and
   wherein the second silicon layer is more heavily doped than the first silicon layer and
   wherein the first silicon layer has a <111> crystallographic orientation and the second silicon layer has a <100> crystallographic orientation.

2. The structure recited in claim 1 wherein the first silicon layer has a thickness of 50-100 microns.

3. The structure recited in claim 1 the first silicon layer is intentionally or unintentionally doped.

4. The structure recited in claim 1 the first silicon layer is n-type doped with a resistivity >500 ohm-cm.

5. The structure recited in claim 2 wherein the second silicon layer has a thickness 625-675 microns.

6. The structure recited in claim 1 including a column III-V layer on the first silicon layer.

7. The structure recited in claim 1 wherein the first insulating layer and the second insulating layer comprises silicon dioxide.

8. The structure recited in claim 1 including a layer of $Al_2O_3$ disposed between the first silicon layer and the first insulating layer.

9. A method, comprising:
   providing a first structure having: a first silicon layer and a first silicon dioxide layer, the first silicon layer being disposed over the first silicon dioxide layer;
   providing a second structure having: a second silicon dioxide layer disposed over a second silicon layer, the second silicon layer being more heavily doped than the first silicon layer;
   bonding the first silicon dioxide layer to the second silicon dioxide;
   polishing an upper surface of the first silicon layer to reduce the thickness of the first silicon layer to a thickness less than the thickness of the second silicon layer;
   forming a III-V layer on the upper surface of the thinned first silicon layer;
   forming a III-V device in the III-V layer together with a strip conductor connected to the formed device;
   successively removing the second silicon layer, the second silicon dioxide layer and the first silicon dioxide layer to expose a bottom surface of the first silicon layer.

10. The method recited in claim 9 including forming the III-V device in the III-V layer together with the strip conductor connected to the formed device over a surface of the III-V layer and electrically conductive vias to the device and through the both III-V layer and the silicon layer of the first structure.

11. The method recited in claim 9 wherein the polishing an upper surface of the silicon layer of the first structure reduces the thickness of the silicon layer of the first structure to a thickness of 50-100 micron.

12. The method recited in claim 9 including forming the ground plane conductor on the exposed bottom surface of the silicon layer of the first structure, the strip conductor and the ground plane conductor providing a microstrip transmission line.

13. The method recited in claim 9 including forming a layer of $Al_2O_3$ on the first silicon layer before the formation of the first insulating layer to dispose the layer of $Al_2O_3$ between the first insulating layer and the first silicon layer.

14. A method comprising:
   (A) providing a first structure having: a first silicon layer and a first insulating layer, the first silicon layer being disposed over the first insulating layer;
   (B) providing a second structure having a and second silicon layer and a second insulating layer, the second insulating layer being disposed over the second silicon layer;
   (C) bonding the first insulating layer to the second insulating layer;
   (D) reducing the thickness of the first silicon layer to a thickness less than the thickness of the second silicon layer;
   (E) forming a III-V layer on an upper surface of the reduced thickness first silicon layer;
   (F) forming a device in the layer and a strip conductor connected to the device; and
   (G) removing the second silicon layer, the second insulating layer, and the first insulating layer, to expose a bottom surface of first silicon layer.

15. The method recited in claim 14 including forming a ground plane conductor on the exposed bottom surface of the first silicon layer connected to provide, with the strip conductor, a microstrip transmission line.

16. The method recited in claim 14 wherein the second silicon layer has a doping concentration higher than the doping concentration of the first silicon layer.

17. The method recited in claim 13 including forming a layer of $Al_2O_3$ on the first silicon layer before the formation of the first insulating layer to dispose the layer of $Al_2O_3$ between the first insulating layer and the first silicon layer.

* * * * *